(12) United States Patent
Hara

(10) Patent No.: US 10,200,044 B2
(45) Date of Patent: Feb. 5, 2019

(54) SEMICONDUCTOR DEVICE HAVING IMPEDANCE CALIBRATION FUNCTION TO DATA OUTPUT BUFFER AND SEMICONDUCTOR MODULE HAVING THE SAME

(71) Applicant: LONGITUDE SEMICONDUCTOR S.A.R.L., Luxembourg (LU)

(72) Inventor: Kentaro Hara, Tokyo (JP)

(73) Assignee: Longitude Licensing Limited, Dublin (IE)

( * ) Notice: Subject to any disclaimer, the term of this patent is extended or adjusted under 35 U.S.C. 154(b) by 0 days.

(21) Appl. No.: 15/402,909

(22) Filed: Jan. 10, 2017

(65) Prior Publication Data

US 2017/0149436 A1 May 25, 2017

Related U.S. Application Data

(63) Continuation of application No. 14/938,351, filed on Nov. 11, 2015, now Pat. No. 9,571,102, which is a (Continued)

(30) Foreign Application Priority Data

Oct. 7, 2011 (JP) ................................ 2011-222935

(51) Int. Cl.
   *H03K 17/16* (2006.01)
   *H03K 19/0185* (2006.01)
   (Continued)

(52) U.S. Cl.
   CPC .. *H03K 19/018557* (2013.01); *G11C 11/4093* (2013.01); *G11C 11/4094* (2013.01);
   (Continued)

(58) Field of Classification Search
   CPC ............ H03K 17/16; H03K 19/00315; H03K 19/017545; G11C 29/12; G11C 11/4093;
   (Continued)

(56) References Cited

U.S. PATENT DOCUMENTS 7,495,453 B2 * 2/2009 Fujisawa ................ G11C 29/02
                                                        324/601
2008/0046212 A1 * 2/2008 Yoko ........................ H03F 1/56
                                                        702/107

(Continued)

*Primary Examiner* — Don Le
(74) *Attorney, Agent, or Firm* — Kunzler, PC

(57) ABSTRACT

Disclosed herein is a semiconductor device that includes a first transistor unit coupled to the data terminal, and a plurality of second transistor units coupled to the calibration terminal. The first transistor unit includes a plurality of first transistors having a first conductivity type connected in parallel to each other so that an impedance of the first transistor unit is adjustable. Each of the second transistor units includes a plurality of second transistors having the first conductivity type connected in parallel to each other so that an impedance of each of the second transistor units is adjustable. The semiconductor device further includes an impedance control circuit that reflects the impedance of each of the second transistor units to the first transistor unit.

9 Claims, 16 Drawing Sheets

Related U.S. Application Data continuation of application No. 14/524,873, filed on Oct. 27, 2014, now Pat. No. 9,209,804, which is a continuation of application No. 13/646,512, filed on Oct. 5, 2012, now Pat. No. 8,878,565.

(51) Int. Cl.

| | | |
|---|---|---|
| *H03K 19/003* | (2006.01) | |
| *H03K 19/0175* | (2006.01) | |
| *G11C 29/02* | (2006.01) | |
| *G11C 29/12* | (2006.01) | |
| *G11C 29/48* | (2006.01) | |
| *G11C 11/4093* | (2006.01) | |
| *H03K 19/00* | (2006.01) | |
| *H03K 19/094* | (2006.01) | |
| *G11C 11/4094* | (2006.01) | |
| *G11C 11/40* | (2006.01) | |
| *G11C 11/4076* | (2006.01) | |

(52) U.S. Cl.
CPC .......... *G11C 29/022* (2013.01); *G11C 29/028* (2013.01); *G11C 29/1201* (2013.01); *G11C 29/48* (2013.01); *H03K 19/0005* (2013.01); *H03K 19/00315* (2013.01); *H03K 19/017545* (2013.01); *H03K 19/094* (2013.01); *G11C 11/40* (2013.01); *G11C 11/4076* (2013.01); *G11C 2207/2254* (2013.01); *H01L 2924/0002* (2013.01)

(58) Field of Classification Search
CPC ......... G11C 29/48; G11C 29/02; G11C 11/40; G11C 11/4076
USPC .......................................................... 326/30
See application file for complete search history.

(56) References Cited

U.S. PATENT DOCUMENTS

| | | | |
|---|---|---|---|
| 2008/0054937 A1* | 3/2008 | Kinoshita | G11C 7/1051 326/30 |
| 2009/0009213 A1* | 1/2009 | Osanai | H03K 19/0005 326/30 |
| 2009/0289658 A1* | 11/2009 | Moon | G11C 5/063 326/30 |
| 2010/0308861 A1* | 12/2010 | Lee | H04L 25/0278 326/30 |
| 2011/0066798 A1* | 3/2011 | Kaiwa | G11C 7/04 711/106 |
| 2011/0109361 A1* | 5/2011 | Nishio | H03K 19/00361 327/170 |
| 2011/0128038 A1* | 6/2011 | Ko | G11C 7/02 326/30 |
| 2011/0193590 A1* | 8/2011 | Nakagawa | G11C 7/1051 326/30 |
| 2011/0267140 A1* | 11/2011 | Kim | H03H 11/30 327/594 |
| 2012/0099383 A1* | 4/2012 | Kim | G11C 7/1057 365/189.02 |

\* cited by examiner

SEMICONDUCTOR DEVICE HAVING IMPEDANCE CALIBRATION FUNCTION TO DATA OUTPUT BUFFER AND SEMICONDUCTOR MODULE HAVING THE SAME

CROSS-REFERENCE TO RELATED APPLICATIONS

The present application is a Continuation application of U.S. patent application Ser. No. 14/938,351, filed on Nov. 11, 2015, which is a Continuation application of U.S. patent application Ser. No. 14/524,873, filed on Oct. 27, 2014, now U.S. Pat. No. 9,209,804 which issued on Dec. 8, 2015, which is a Continuation application of U.S. patent application Ser. No. 13/646,512, filed on Oct. 5, 2012, now U.S. Pat. No. 8,878,565 which issued on Nov. 4, 2014, which is based on Japanese Patent Application No. 2011-222935 filed on Oct. 7, 2011, all of which are incorporated herein by reference in their entirety.

BACKGROUND OF THE INVENTION

Field of the Invention

The present invention relates to a semiconductor device and a semiconductor module having the semiconductor device and, in particular, relates to a semiconductor device having an impedance calibration function to a data output buffer and a semiconductor module having the semiconductor device.

Description of Related Art

Some semiconductor devices that perform high-speed data transfer, such as DRAM (Dynamic Random Access Memory), include a calibration circuit for adjusting an impedance of a data output buffer. The calibration circuit includes a calibration terminal and a replica buffer connected thereto. The replica buffer is a circuit having substantially the same circuit structure as that of the data output buffer. To the calibration terminal, an external resistance having a target impedance of the data output buffer is connected. Calibration is performed by adjusting impedance of the replica buffer so as to correspond to the impedance of the external resistance, and reflecting the adjusted impedance on the data output buffer (refer to Japanese Patent Application Laid-Open No. 2010-21994).

According to a calibration circuit described in the Japanese Patent Application Laid-Open No. 2010-21994, a level of a reference potential to be compared with a potential of a calibration terminal is set to one half (0.5 VDD) of a power supply potential (VDD). Depending on specifications, however, the reference potential may be set to the level offset from one half of the power supply potential, which makes it difficult to perform precise calibration operation at all times.

SUMMARY

In one embodiment, there is provided a semiconductor device that includes: a data terminal; a calibration terminal; a first transistor unit coupled to the data terminal, the first transistor unit including a plurality of first transistors having a first conductivity type connected in parallel to each other so that an impedance of the first transistor unit is adjustable; a plurality of second transistor units coupled to the calibration terminal, each of the second transistor units including a plurality of second transistors having the first conductivity type connected in parallel to each other so that an impedance of each of the second transistor units is adjustable; and an impedance control circuit reflecting the impedance of each of the second transistor units to the first transistor unit.

In another embodiment, there is provided a semiconductor device that includes: a data terminal; a calibration terminal; a first power supply line supplied with a first power supply potential; a first transistor unit coupled between the first power supply line and the data terminal; a plurality of second transistor units coupled between the first power supply line and the calibration terminal; and an impedance control circuit adjusting an impedance of each of the second transistor units so that a potential of the calibration terminal matches with a reference potential, the impedance control circuit reflecting the impedance of one of the second transistor units to the first transistor unit.

In still another embodiment, there is provided a semiconductor device that includes: a first terminal; a second terminal supplied with a reference voltage; one or more first transistor units, each of the first transistor units including a plurality of first transistors of a first conductivity type, the first transistors of each of the first transistor units being coupled in parallel to the first terminal and being respectively controlled in response to first calibration signals; one or more second transistor units, each of the second transistor units including a plurality of second transistors of a second conductivity type, the second transistors of each of the second transistor units being coupled in parallel to the first terminal and being respectively controlled in response to second calibration signals; and an impedance control circuit coupled to the first and second terminals, and being configured to compare an electrical potential of the first terminal with the reference potential of the second terminal to generate the second calibration signals. The number of the first transistor units being different from the number of the second transistor units.

In one embodiment, there is provided a semiconductor module that includes: a module board; and a semiconductor device and an external resistance mounted on the module board. The semiconductor device includes: a data terminal; a calibration terminal to which the external resistance is connected; a first transistor unit coupled to the data terminal; a plurality of second transistor units coupled to the calibration terminal; and an impedance control circuit adjusting an impedance of each of the second transistor units so that the impedance of each of the second transistor units matches with an impedance of the external resistance, the impedance control circuit reflecting the impedance of one of the second transistor units to the first transistor unit.

DETAILED DESCRIPTION OF THE EMBODIMENTS

Before explaining preferred embodiments of the present invention, an explanation is made about the reason why precise calibration operation cannot be performed when a reference potential is set to a level offset from one half of a power supply potential. The following explanation is given by a study of the inventor.

Figure 1A:
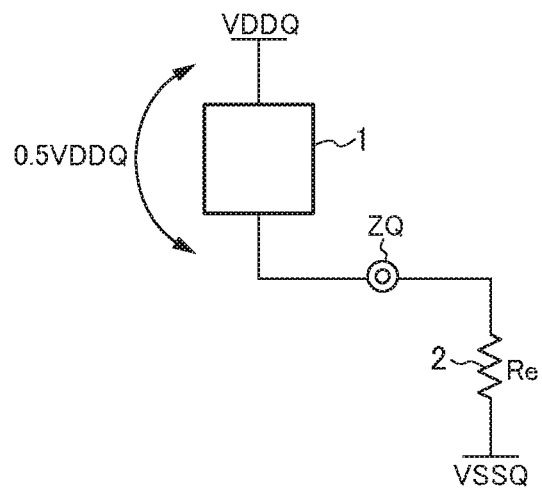
FIG. 1A is a schematic view showing a connection between a replica buffer 1 and an external resistance 2.

Referring now to FIG. 1A, the replica buffer 1 is connected between a power supply line supplying a higher power supply potential VDDQ and a calibration terminal ZQ. The replica buffer 1 is a p-type transistor unit consisting of a plurality of p-channel MOS transistors connected in parallel. The external resistance is connected between a power supply line supplying a lower power supply potential VSSQ and the calibration terminal ZQ. An impedance Re of the external resistance 2 corresponds to a target impedance of a data output buffer. Therefore, the impedance of the data output buffer corresponds to a target value Re when an impedance of the replica buffer 1 is adjusted so that a potential of the calibration terminal ZQ becomes an intermediate potential, namely 0.5 VDDQ, and the adjustment is reflected on the data output buffer.

However, the data output buffer is formed by a transistor, and its impedance is attributable to on-resistance of the transistor. Therefore, unlike the common resistors, unignorable variations in the impedance of the data output buffer are caused due to voltage. With the common resistor, its impedance is almost constant irrespective of the voltage applied across the resistor. With the transistor, on the contrary, its impedance changes if source-drain voltage changes even though gate-source voltage is the same. This should be taken into account in the calibration operation. Accordingly, when the result of the calibration using the calibration circuit shown in FIG. 1A is reflected on the data output buffer, the impedance of the data output buffer corresponds to Re properly if the source-drain voltage is 0.5 VDDQ, but the impedance of the data output buffer is deviated from Re if the source-drain voltage is offset from 0.5 VDDQ.

Figure 1B:
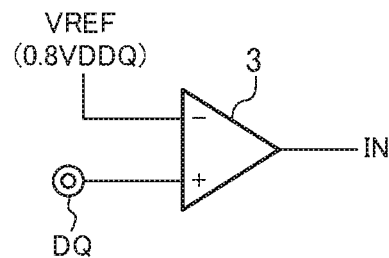
FIG. 1B is a circuit diagram of a data input receiver 3.

The data input receiver 3 shown in FIG. 1B has the structure in which a positive input node (+) is connected to a data terminal DQ and a negative input node (−) is supplied with a reference potential VREF. The level of the reference potential is offset from an intermediate level, and is set to 0.8 VDDQ in this example. In this case, when the level of the data terminal DQ is more than 0.8 VDDQ, a signal IN outputted from the data input receiver 3 becomes the high level, and when the level of the data terminal DQ is less than 0.8 VDDQ, on the contrary, the signal IN outputted from the data input receiver 3 becomes the low level.

Figure 1C:
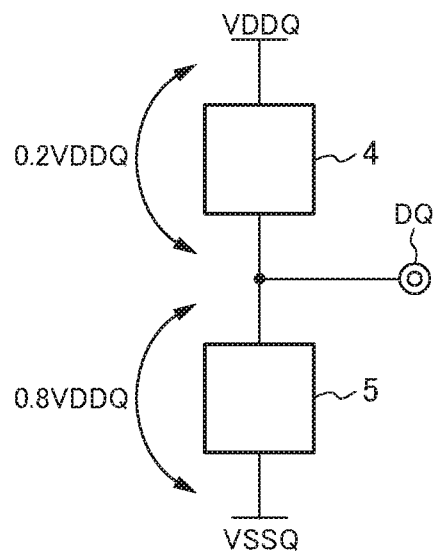
FIG. 1C is a schematic view showing a connection between a pull-up buffer 4 and a pull-down buffer 5.

When such a data input receiver 3 is used, as shown in FIG. 1C, an impedance of a pull-up buffer 4 forming the data output buffer needs to be Re on the condition that the source-drain voltage is 0.2 VDDQ. Moreover, an impedance of a pull-down buffer 5 forming the data output buffer needs to be Re on the condition that the source-drain voltage is 0.8 VDDQ.

Accordingly, when the impedance of the replica buffer 1 in the calibration circuit shown in FIG. 1A is reflected on the pull-up buffer 4 and the pull-down buffer 5 without any change, the impedances do not correspond to Re and the impedance values slightly deviate from Re. Recognizing such a problem, the inventor has made diligent studies in order to solve the problem.

In order to solve the problem, it is possible to employ a method of using the external resistance 2 having an impedance of 4 Re. When the impedance of the replica buffer 1 is adjusted to allow the potential of the calibration terminal ZQ shown in FIG. 1A to be 0.8 VDDQ, according to this method, the obtained impedance becomes Re. When this is reflected on the pull-up buffer 4, it is possible to make the impedance of the pull-up buffer 4 Re on the condition that the source-drain voltage is 0.2 VDDQ.

In this case, however, it is necessary to use the external resistance 2 having a large resistance value, which increases the size of the external resistance 2. This may cause an increase in a mounting area on a module board, and also an increase in the cost. Furthermore, the method still has such a problem that the impedance of the pull-down buffer 5 cannot be adjusted properly although the impedance of the pull-up buffer 4 can be adjusted properly. The present invention has been made to solve the above-described problems. Hereinafter, the preferred embodiments of the present invention will be explained in detail with reference to the attached drawings.

Figure 2:
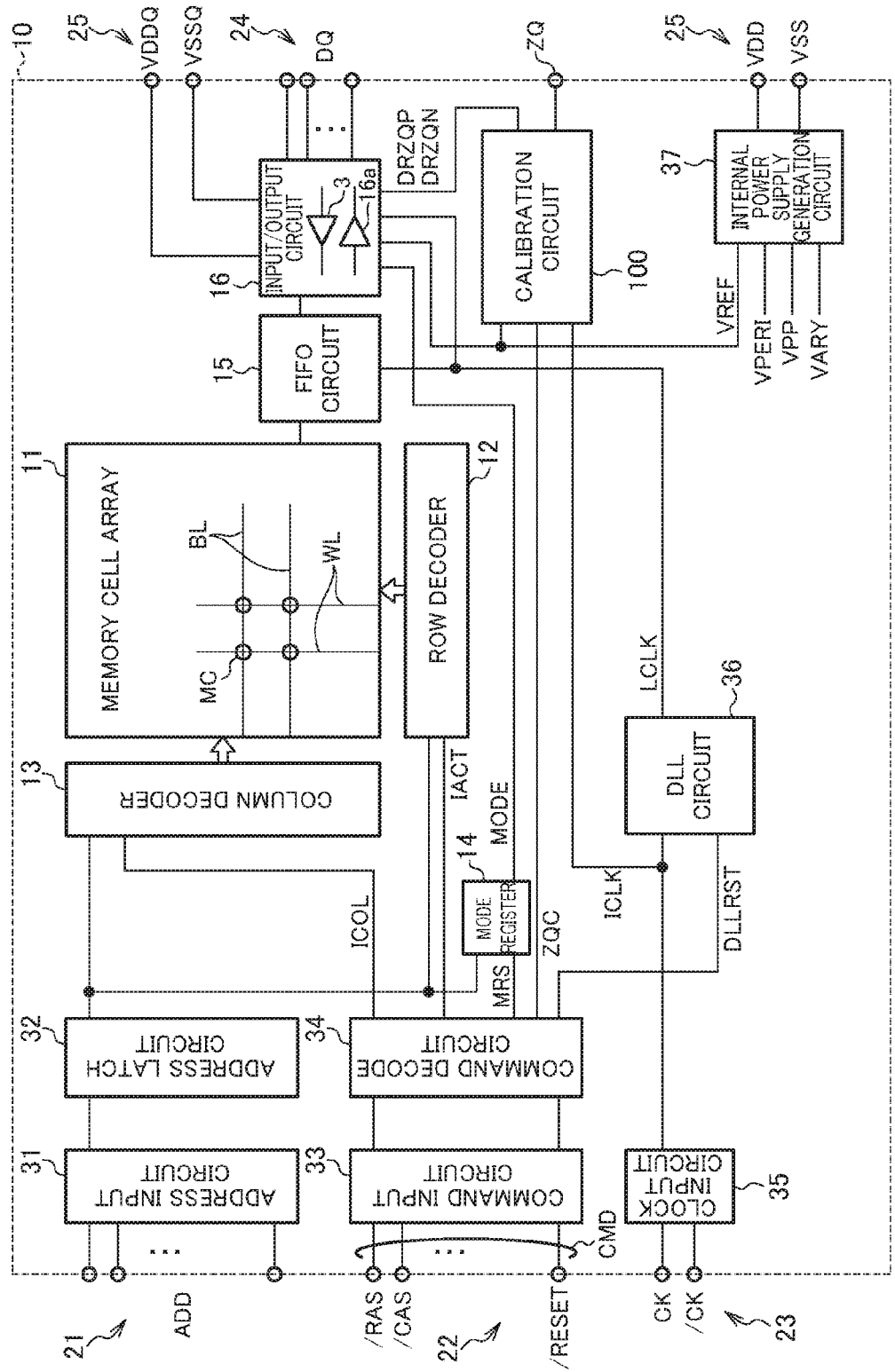
FIG. 2 is a block diagram indicative of an embodiment of an overall configuration of a semiconductor device 10 according to an embodiment of the present invention.

Referring now to FIG. 2, the semiconductor device 10 according to the present embodiment is a DRAM integrated in a semiconductor chip, and includes a memory cell array 11. The memory cell array 11 includes a plurality of word lines WL, a plurality of bit lines BL, and a plurality of memory cells MC arranged at their intersections. The selection of the word line WL is performed by a row decoder 12 and the selection of the bit line BL is performed by a column decoder 13.

As shown in FIG. 2, the semiconductor device 10 includes, as external terminals thereof, an address terminal 21, a command terminal 22, a clock terminal 23, a data terminal 24, a power supply terminal 25, and a calibration terminal ZQ.

The address terminal 21 is a terminal to which an address signal ADD is supplied from outside. The address signal ADD input to the address terminal 21 is supplied via an address input circuit 31 to an address latch circuit 32 that latches the address signal ADD. The address signal ADD latched in the address latch circuit 32 is supplied to the row decoder 12, the column decoder 13, or a mode register 14. The mode register 14 is a circuit in which parameters indicating an operation mode of the semiconductor device 10 are set.

The command terminal 22 is a terminal to which a command signal CMD is supplied from outside. The command signal CMD is constituted by a plurality of signals such as a row-address strobe signal /RAS, a column-address strobe signal /CAS, and a reset signal /RESET. The slash "/" attached to the head of a signal name indicates an inverted signal of a corresponding signal or indicates that the corresponding signal is a low-active signal. The command signal CMD input to the command terminal 22 is supplied via a command input circuit 33 to a command decode circuit 34. The command decode circuit 34 decodes the command signal CMD to generate various internal commands. As these internal commands, an active signal IACT, a column signal ICOL, a mode register set signal MRS, a calibration signal ZQC, and a DLL reset signal DLLRST are provided.

The active signal IACT is activated when the command signal CMD indicates a row access (an active command). When the active signal IACT is activated, the address signal ADD latched in the address latch circuit 32 is supplied to the row decoder 12. The word line WL designated by this address signal ADD is selected accordingly.

The column signal ICOL is activated when the command signal CMD indicates a column access (a read command or a write command). When the column signal ICOL is activated, the address signal ADD latched in the address latch circuit 32 is supplied to the column decoder 13. In this manner, the bit line BL designated by this address signal ADD is selected.

Accordingly, when the active command and the read command are supplied in this order and a row address and a column address are supplied in synchronism with these commands, read data is read from a memory cell MC designated by these row address and column address. Read data DQ is output to outside from the data terminal 24 via an FIFO circuit 15 and an input/output circuit 16. Read data DQ is output by using a data output buffer 16a included in the input/output circuit 16. Basic configuration of the data output buffer 16a is as shown in FIG. 1C, i.e., the pull-up buffer 4 and the pull-down buffer are connected in series.

Meanwhile, when the active command and the write command are supplied in this order, a row address and a column address are supplied in synchronism with these commands, and then write data DQ is supplied to the data terminal 24, the write data DQ is supplied via the input/output circuit 16 and the FIFO circuit 15 to the memory cell array 11 and written in the memory cell MC designated by these row address and column address. Write data DQ is received by using a data input receiver 3 included in the input/output circuit 16. Basic configuration of the data input receiver 3 is as shown in FIG. 1B, i.e., a logic level of write data DQ is determined by comparing the reference potential VREF with a level of the data terminal 24.

The FIFO circuit 15 and the input/output circuit 16 are operated in synchronism with an internal clock signal LCLK. The internal clock signal LCLK is generated by a DLL circuit 36.

The mode register set signal MRS is activated when the command signal CMD indicates a mode register set command. Accordingly, when the mode register set command is supplied and a mode signal is supplied from the address terminal 21 in synchronism with this command, a set value of the mode register 14 can be rewritten.

The calibration signal ZQC is activated, when the reset signal/RESET changes from an active state to an inactive state, or when the command signal CMD indicates a calibration command. When the calibration signal ZQC is activated, the calibration circuit 100 shown in FIG. 2 is started and calibration operation is performed. The details of the calibration circuit 100 are described later.

The DLL reset signal DLLRST is activated, when the reset signal/RESET changes from an active state to an inactive state, or when the command signal CMD indicates a DLL reset command. When the DLL reset signal DLLRST is activated, the DLL circuit 36 is restarted.

A pair of clock terminals 23 is supplied with external clock signals CK and /CK from outside, respectively. These external clock signals CK and /CK are complementary to each other and then transferred to a clock input circuit 35. The clock input circuit 35 generates an internal clock signal ICLK based on the external clock signals CK and /CK. The internal clock signal ICLK is a basic clock signal within the semiconductor device 10 and supplied to circuit blocks.

The internal clock signal ICLK is also supplied to the DLL circuit 36. The DLL circuit 36 generates the internal clock signal LCLK based on the internal clock signal ICLK. The internal clock signal LCLK is a clock signal that is phase-controlled. As explained above, the internal clock signal LCLK is supplied to the FIFO circuit 15 and the input/output circuit 16. In this manner, the read data DQ is output in synchronism with the internal clock signal LCLK.

The power supply terminal 25 is supplied with power supply potentials VDD, VDDQ, VSS, and VSSQ. The power supply potentials VDD and VDDQ are higher power supply potentials and both potentials are the same. The power supply potentials VSS and VSSQ are lower power supply potentials (ground potentials) and both potentials are the same. The power supply potentials VDDQ and VSSQ are dedicated power supply for the input/output circuit 16. The power supply potentials VDD and VSS are used for the other circuit blocks. However, in the present invention, it is not indispensable to separate the power supply potential VDD and the power supply potential VDDQ or to separate the power supply potential VSS and the power supply potential VSSQ.

An internal power supply generation circuit 37 generates various internal potentials VPP, VPERI, VARY, and the reference potential VREF, and the like. The internal potential VPP is mainly used for the row decoder 12. The row decoder 12 drives a word line which has been selected based on the address signal ADD to the VPP level. Thus, a cell transistor included in a memory cell is conducted. The internal potential VARY is used for a sense amplifier, which is not shown in the drawing. When the sense amplifier is activated, one of a pair of bit lines is driven to the VARY level and the other of the pair of bit lines is driven to the VSS level. Thereby read data read out from a memory cell is amplified. The internal potential VPERI is used as operating potential for most peripheral circuits including the address latch circuit 32 and the command decode circuit 34. When the internal potential VPERI, which is lower than the power supply potential VDD, is used as the operating potential for the peripheral circuits, low power consumption is achieved.

The reference potential VREF is supplied with the data input receiver 3 and used for calibration operation of the calibration circuit 100.

Figure 3:
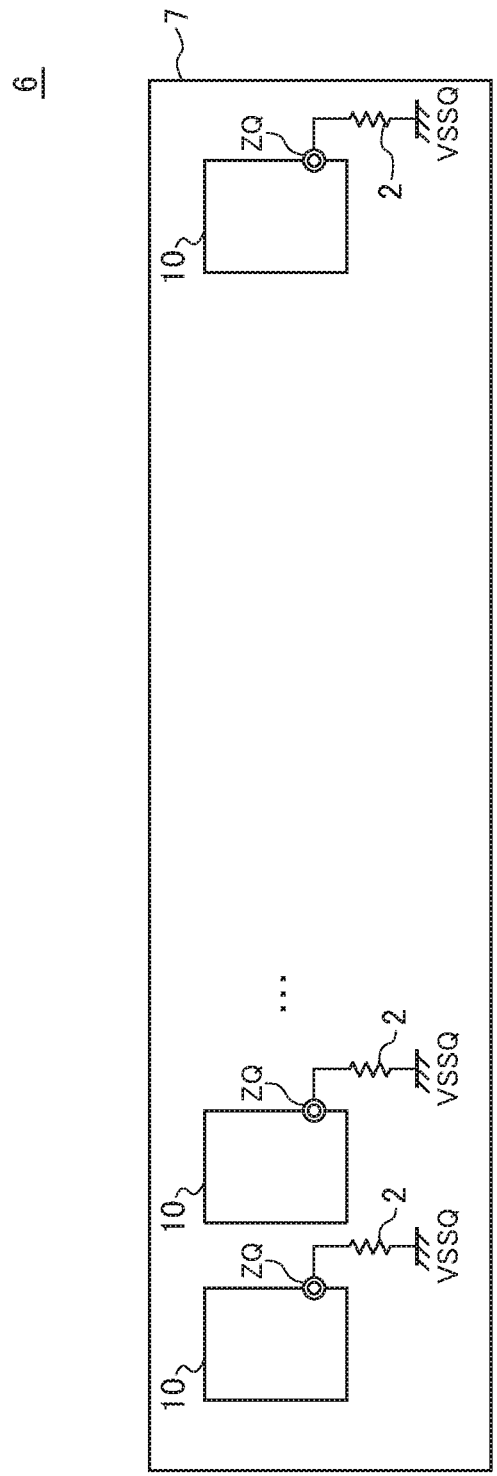
FIG. 3 is a schematic view indicative of an embodiment of a semiconductor module 6 including the semiconductor devices 10 according to the embodiment.

Turning to FIG. 3, the semiconductor module 6 has the structure in which a plurality of the semiconductor devices 10 are mounted on a module board 7. The calibration terminal ZQ of each semiconductor device 10 is connected to one end of the external resistance 2 mounted on the module board 7. The other end of the external resistance 2 is connected to the power supply potential VSSQ (or VSS).

Figure 4:
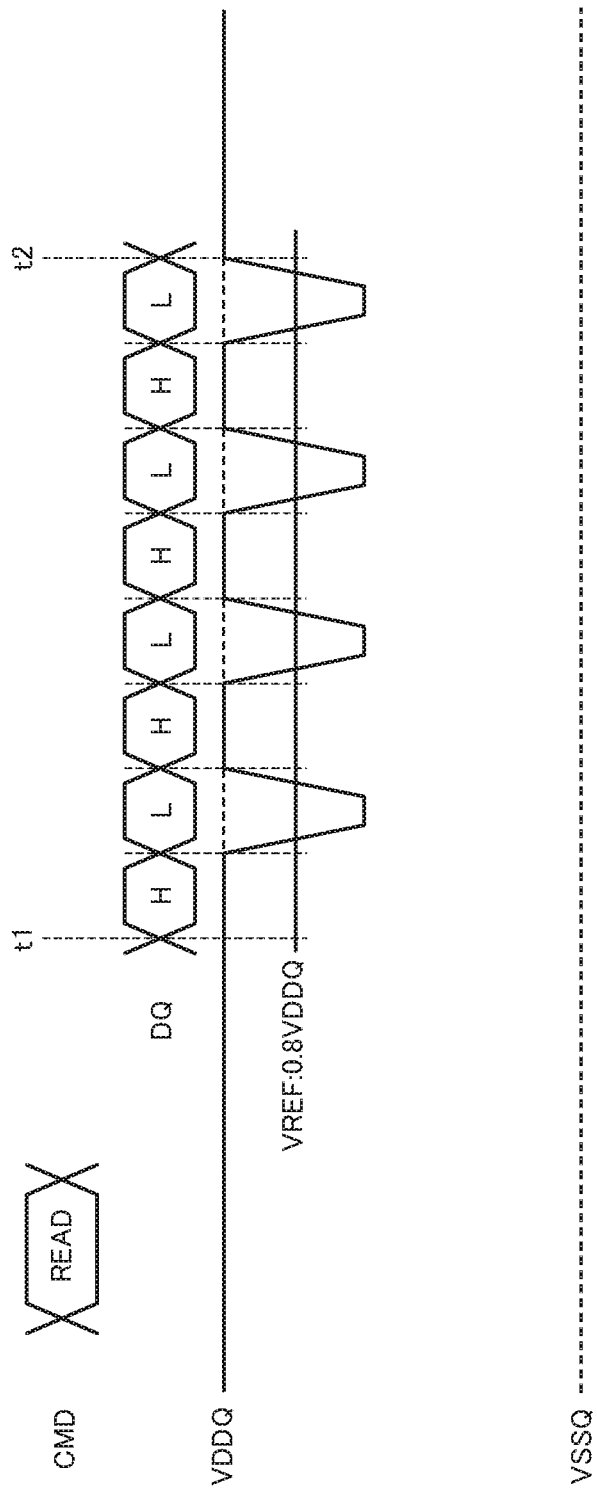
FIG. 4 is a waveform chart of read data DQ outputted from an input/output circuit 16 via a data terminal 24.

Turning to FIG. 4, when a read command READ is issued from the outside, burst output of the read data DQ is performed from the input/output circuit 16 after a predetermined latency. In the example shown in FIG. 4, the burst output of the read data DQ is started from a time t1, and the burst output is completed at a time t2. During periods before the time t1 when the burst output is started and after the time t2 when the burst output is completed, the level of the data terminal 24 is terminated at VDDQ. During a period while the burst output is performed, the level of the data terminal 24 changes depending on a logic level of the read data DQ. Specifically, the data terminal 24 is driven to the VDDQ level when the read data DQ is the high level, and the data terminal 24 is driven to the level of about 0.6 VDDQ when the read data DQ is the low level.

Here, the level as a threshold that determines whether the read data DQ is the high level or the low level is 0.8 VDDQ, which becomes the level of the reference potential VREF. The reference potential VREF corresponds to the reference potential to be inputted to the data input receiver 3 shown in FIG. 1B.

Figure 5:
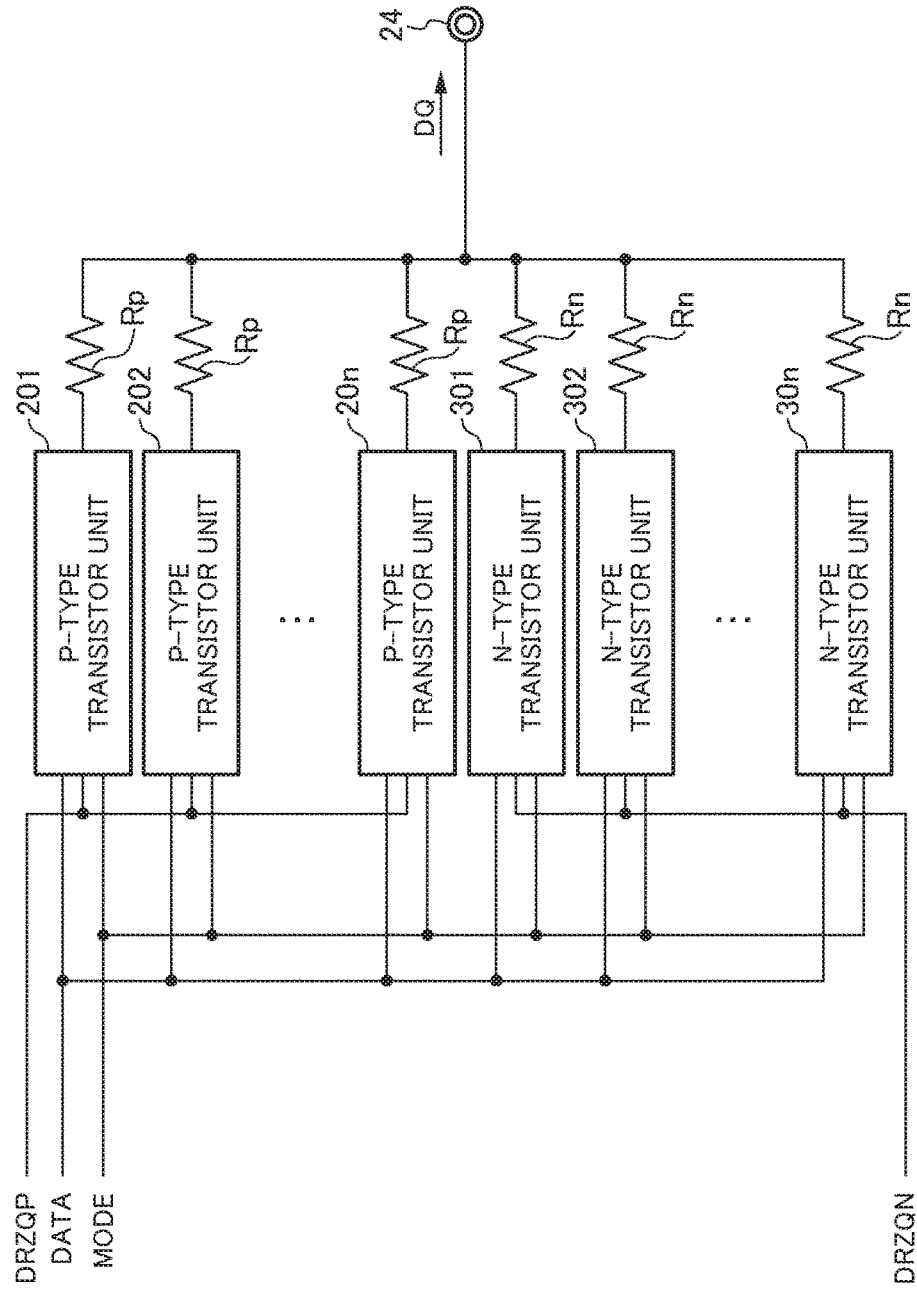
FIG. 5 is a block diagram indicative of an embodiment of the structure of a data output buffer 16a included in the input/output circuit 16.

Turning to FIG. 5, the data output buffer 16a has the structure in which n p-type transistor units 201 to 20n and n n-type transistor units 301 to 30n are connected to the data terminal 24. The p-type transistor units 201 to 20n are connected in parallel to the data terminal 24 via resistors Rp, respectively, and the number of the p-type transistor units 201 to 20n to be activated among them can be selected by a mode signal MODE. According to the present invention, each of the p-type transistor units 201 to 20n may be referred to as a "first transistor unit". Similarly, the n-type transistor units 301 to 30n are connected in parallel to the data terminal 24 via resistors Rn, respectively, and the number of the n-type transistor units 301 to 30n to be activated among them can be selected by the mode signal MODE. According to the present invention, each of the n-type transistor units 301 to 30n may be referred to as a "third transistor unit".

An internal data DATA specifies which of the p-type transistor units 201 to 20n and the n-type transistor units 301 to 30n to be activated. The internal data DATA is a data signal to specify the logic level of the read data DQ. When outputting the high-level read data DQ from the data terminal 24, at least one of the p-type transistor units 201 to 20n is activated. At this time, all of the n-type transistor units 301 to 30n are deactivated. Therefore, the data terminal 24 is driven to the high level. On the other hand, when outputting the low-level read data DQ from the data terminal 24, at least one of the n-type transistor units 301 to 30n is activated. At this time, all of the p-type transistor units 201 to 20n are deactivated. Thus, the data terminal 24 is driven to the low level.

Impedances of the transistor units are equal to each other, and set to 240Ω, for example. Therefore, when the m (0<m≤n) transistor units among the p-type transistor units 201 to 20n are activated, the impedances of the p-type transistor units 201 to 20n become 240 Ω/m when viewed from the data terminal 24. Similarly, when the m (0<m≤n) transistor units among the n-type transistor units 301 to 30n are activated, the impedances of the n-type transistor units 301 to 30n become 240 Ω/m when viewed from the data terminal 24. The number of n may be seven, for example, although not particularly limited. As described above, the number of m can be selected by the mode signal MODE. The mode signal MODE is a signal supplied by the mode register 14 shown in FIG. 2, and hence it is possible to change the mode signal MODE by issuing a mode register set command.

The impedances of the respective p-type transistor units 201 to 20n are specified by an impedance code DRZQP. As the impedance code DRZQP is commonly supplied to the p-type transistor units 201 to 20n, the p-type transistor units 201 to 20n are adjusted to have the same impedance. Similarly, the impedances of the respective n-type transistor units 301 to 30n are specified by an impedance code DRZQN. As the impedance code DRZQN is commonly supplied to the n-type transistor units 301 to 30n, the n-type transistor units 301 to 30n are adjusted to have the same impedance.

Figure 6:
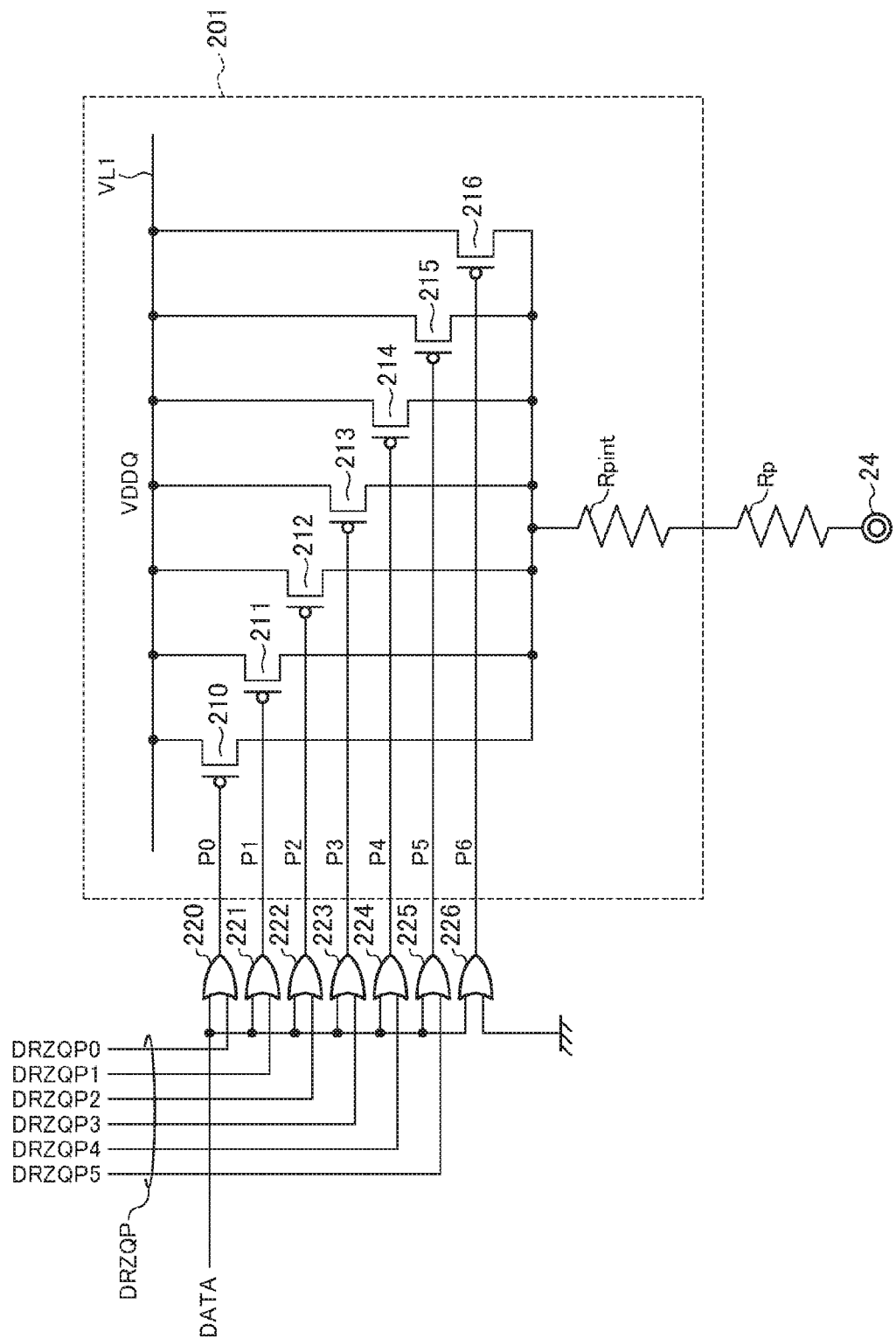
FIG. 6 is a circuit diagram indicative of an embodiment of a p-type transistor unit 201.

Turning to FIG. 6, a circuit diagram of the p-type transistor unit 201 is shown. Other p-type transistor units 202 to 20n have the same circuit structure, and repeated explanation will be omitted.

As shown in FIG. 6, the p-type transistor unit 201 has the structure in which seven p-channel MOS transistors 210 to 216 are connected in parallel, and serves as a pull-up buffer. Sources of the transistor 210 to 216 are commonly connected to a power supply line VL1 supplying the power supply potential VDDQ, and drains of the transistors 210 to 216 are commonly connected to the data terminal 24 via resistors Rpint and Rp. The resistor Rpint may be a resistance component of a high resistance wire such as tungsten, titanium nitride and the like, and the resistor Rp may be a resistance component of a low resistance wire such as aluminum, copper and the like, although not restrictive. As an example, supposing that the on-resistance of the p-channel MOS transistors 210 to 216 connected in parallel is 120Ω, the resistor Rpint using the tungsten wire with a specific resistance of 3Ω is 110Ω, and the resistor Rp using the aluminum wire with a specific resistance of 0.2Ω is 10Ω, the total resistance value becomes 240Ω. According to the present invention, the resistor Rp may be referred to as a "first resistor".

Control signals P0 to P6 are respectively supplied to gate electrodes of the transistors 210 to 216. The control signals P0 to P6 are respectively outputted from corresponding OR gate circuits 220 to 226. The internal data DATA is commonly supplied to one input nodes of the OR gate circuits 220 to 226. Further, corresponding bits DRZQP0 to DRZQP5 of the impedance code DRZQP are supplied to the other input nodes of the OR gate circuit 220 to 225, respectively. The other input node of the OR gate circuit 226 is fixed to the low level.

With the structure described above, when the internal data DATA becomes the low level, one transistor or two or more transistors turn on among the transistors 210 to 216 based on the impedance code DRZQP. The impedance code DRZQP is a signal generated by the calibration circuit 100 that will be described later, and adjusts the impedance of the p-type transistor unit 201 to a designed value (240Ω, for example), even when temperature changes, voltage fluctuations and the like are caused. When the internal data DATA becomes the high level, on the other hand, all the transistors 210 to 216 turn off.

Figure 7:
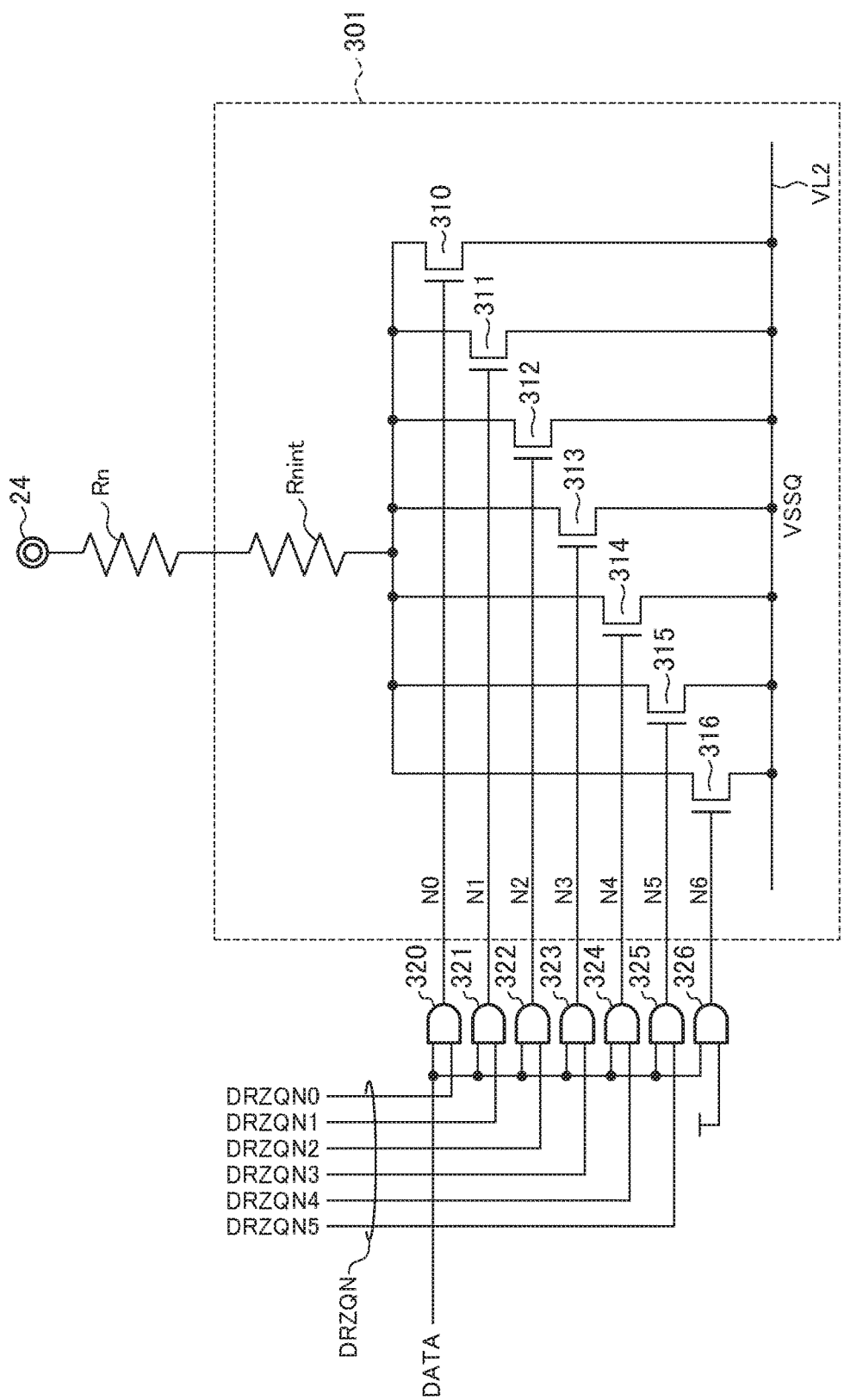
FIG. 7 is a circuit diagram indicative of an embodiment of a n-type transistor unit 301.

Turning to FIG. 7, a circuit diagram of the n-type transistor unit 301 is shown. Other n-type transistor units 302 to 30n have the same circuit structure, and repeated explanation will be omitted.

As shown in FIG. 7, the n-type transistor unit 301 has the structure in which seven n-channel MOS transistors 310 to 316 are connected in parallel, and serves as a pull-down buffer. Sources of the transistor 310 to 316 are commonly connected to a power supply line VL2 supplying the power supply potential VSSQ, and drains of the transistors 310 to 316 are commonly connected to the data terminal 24 via resistors Rnint and Rn. The resistor Rnint corresponds to the resistor Rpint shown in FIG. 6. The resistor Rn corresponds to the resistor Rp shown in FIG. 6.

Control signals N0 to N6 are respectively supplied to gate electrodes of the transistors 310 to 316. The control signals N0 to N6 are respectively outputted from corresponding AND gate circuits 320 to 326. The internal data DATA is commonly supplied to one input nodes of the AND gate circuits 320 to 326. Further, corresponding bits DRZQN0 to DRZQN5 of the impedance code DRZQN are supplied to the other input nodes of the AND gate circuit 320 to 325, respectively. The other input node of the AND gate circuit 326 is fixed to the high level.

With the structure described above, when the internal data DATA becomes the high level, one transistor or two or more transistors turn on among the transistors 310 to 316 based on the impedance code DRZQN. The impedance code DRZQN is a signal generated by the calibration circuit 100 that will be described later, and adjusts the impedance of the n-type transistor unit 301 to a designed value (240Ω, for example), even when temperature changes, voltage fluctuations and the like are caused. When the internal data DATA becomes the low level, on the other hand, all the transistors 310 to 316 turn off.

In the examples shown in FIG. 6 and FIG. 7, the seven transistors connected in parallel are included in one transistor unit, but the number of the transistors to be connected in parallel and included in one transistor unit is not particularly limited. The transistor 216 that is not controlled by the impedance code DRZQP is provided in order to avoid a high impedance state even when all other transistors 210 to 215 turn off in the case where the impedance code DRZQP exhibits a maximum value (or a minimum value). The transistor 316 that is not controlled by the impedance code DRZQN is provided because of the similar reason. It is not necessarily required, however, to provide such transistors in the present invention.

Figure 8:
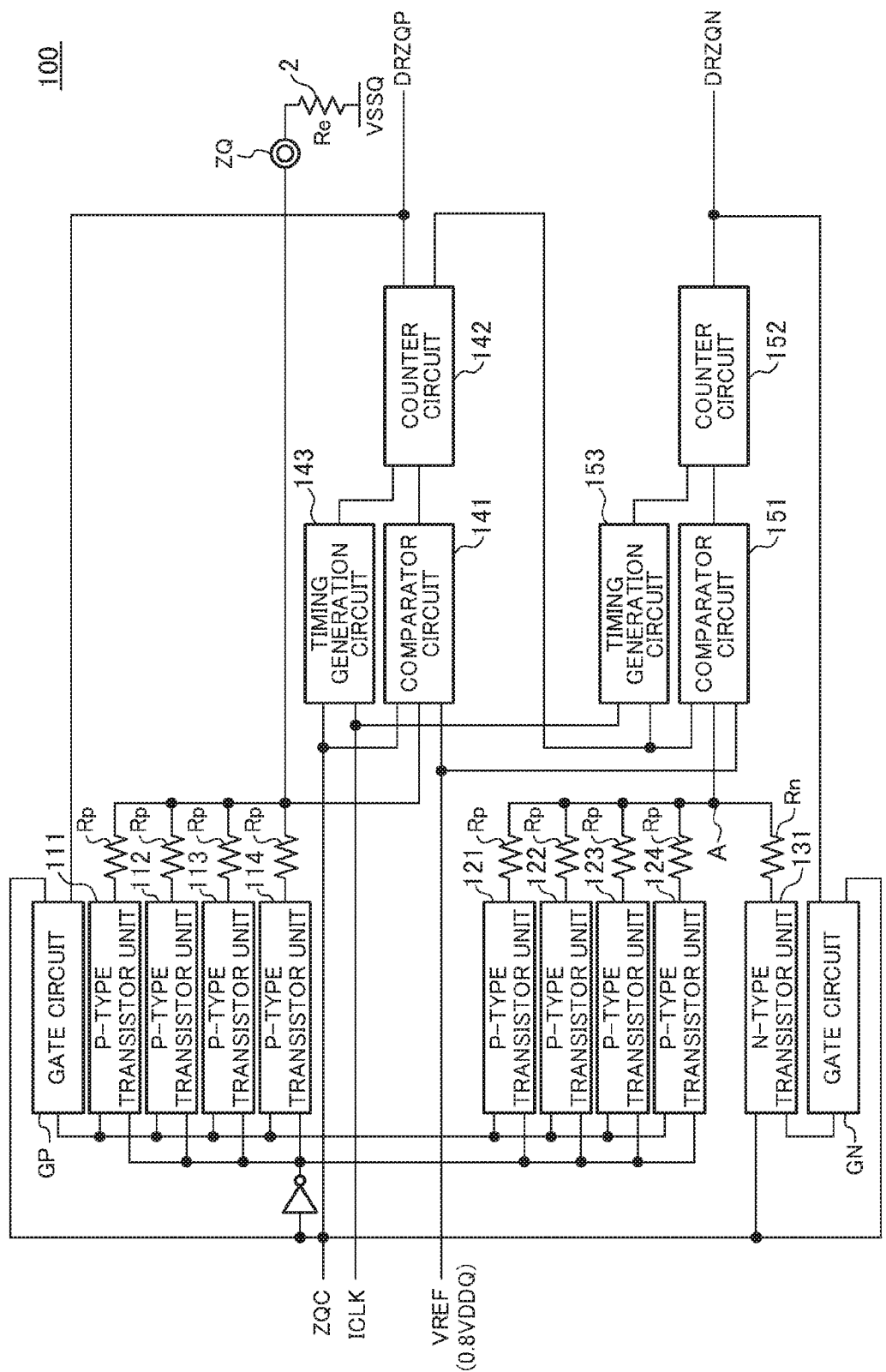
FIG. 8 is a block diagram indicative of an embodiment of the structure of a calibration circuit 100 according to a first preferred embodiment.

Turning to FIG. 8, the calibration circuit 100 includes four p-type transistor units 111 to 114 that are connected in parallel to the calibration terminal ZQ, four p-type transistor units 121 to 124 that are connected in parallel to an internal node A, and one n-type transistor unit 131. The above-described external resistance 2 is connected to the calibration terminal ZQ. The impedance Re of the external resistance 2 is 240Ω in the above example, and corresponds to a target impedance of the respective transistor units. According to the present invention, each of the p-type transistor units 111 to 114 may be referred to as a "second transistor unit", each of the p-type transistor units 121 to 124 may be referred to as a "fifth transistor unit", and the n-type transistor unit 131 may be referred to as a "fourth transistor unit".

The respective p-type transistor units 111 to 114 and 121 to 124 are replica buffers of the respective p-type transistor units 201 to 20n that serve as the pull-up buffers. Accordingly, the circuit structure of each of the p-type transistor units 111 to 114 is substantially the same as that of the p-type transistor unit 201 shown in FIG. 6, except that the calibration terminal ZQ is connected thereto instead of the data terminal 24. Similarly, the circuit structure of each of the p-type transistor units 121 to 124 is substantially the same as that of the p-type transistor unit 201 shown in FIG. 6, except that the internal node A is connected thereto instead of the data terminal 24. Meanwhile, the n-type transistor unit 131 is a replica buffer of each of the n-type transistor units 301 to 30n that serve as the pull-down buffers. Accordingly, the circuit structure of the n-type transistor unit 131 is substantially the same as that of the n-type transistor unit 301 shown in FIG. 7, except that the internal node A is connected thereto instead of the data terminal 24.

The potential of the calibration terminal ZQ is compared with the reference potential VREF by a comparator circuit 141. The level of the reference potential VREF is 0.8 VDDQ. The result of the comparison by the comparator circuit 141 is supplied to a counter circuit 142. The counter circuit 142 is a counter that uses the impedance code DRZQP as a count value, and counts up or down based on the result of the comparison by the comparator circuit 141. Count operation of the counter circuit 142 is controlled by a timing generation circuit 143. The timing generation circuit 143 is activated based on the calibration signal ZQC and controls operation timing of the counter circuit 142 in synchronization with a frequency-divided clock signal that is the internal clock signal ICLK with its frequency divided.

Similarly, the potential of the internal node A is compared with the reference potential VREF by a comparator circuit 151, and the result of the comparison is supplied to a counter circuit 152. The counter circuit 152 is a counter that uses the impedance code DRZQN as a count value, and counts up or down based on the result of the comparison by the comparator circuit 151. Count operation of the counter circuit 152 is controlled by a timing generation circuit 153. The timing generation circuit 153 is activated based on the calibration signal ZQC and controls operation timing of the counter circuit 152 in synchronization with the frequency-divided clock signal that is the internal clock signal ICLK with its frequency divided. According to the present invention, a circuit block consisting of the comparator circuits 141 and 151, the counter circuits 142 and 152 and the timing generation circuits 143 and 153 may be referred to as an "impedance control circuit".

The impedance code DRZQP outputted from the counter circuit 142 is commonly supplied via a gate circuit GP to the p-type transistor units 111 to 114 and 121 to 124. The gate circuit GP plays a role of supplying the impedance code DRZQP to the p-type transistor units 111 to 114 and 121 to 124 when the calibration signal ZQC is activated. That is, the calibration signal ZQC corresponds to the internal data DATA shown in FIG. 6. Therefore, when the calibration signal ZQC is in a deactivated state, all of transistors constituting the p-type transistor units 111 to 114 and 121 to 124, except for the transistors not controlled by the impedance code DRZQP, are turned off, irrespective of the impedance code DRZQP. Further, the power supply potential VDDQ supplied to the p-type transistor units 111 to 114 and 121 to 124 is also controlled by the calibration signal ZQC and, when the calibration signal ZQC is in the deactivated state, the p-type transistor units 111 to 114 and 121 to 124 are detached from the power supply potential VDDQ. Thus, reduction in power consumption is achieved during a period when the calibration operation is not performed.

Similarly, the impedance code DRZQN outputted from the counter circuit 152 is supplied via a gate circuit GN to the n-type transistor unit 131. The gate circuit GN plays a role of supplying the impedance code DRZQN to the n-type transistor unit 131 when the calibration signal ZQC is activated. That is, the calibration signal ZQC corresponds to the internal data DATA shown in FIG. 7. Therefore, when the calibration signal ZQC is in the deactivated state, all of transistors constituting the n-type transistor unit 131, except for the transistor not controlled by the impedance code DRZQN, are turned off, irrespective of the impedance code DRZQN. Further, the power supply potential VSSQ supplied to the n-type transistor unit 131 is also controlled by the calibration signal ZQC and, when the calibration signal ZQC is in the deactivated state, the n-type transistor unit 131 is detached from the power supply potential VSSQ. Thus, the reduction in power consumption is achieved during the period when the calibration operation is not performed.

Figure 9:
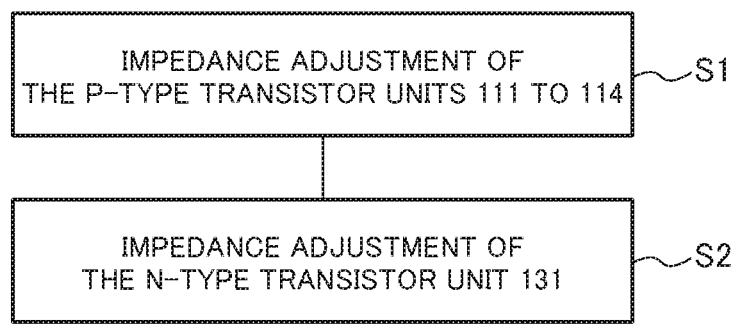
FIG. 9 is a flow chart for explaining calibration operation.

Turning to FIG. 9, the operation of the calibration circuit 100 is performed in the order of impedance adjustment of the p-type transistor units 111 to 114 (step S1) and impedance adjustment of the n-type transistor unit 131 (step S2).

Figures 10A, 10B:
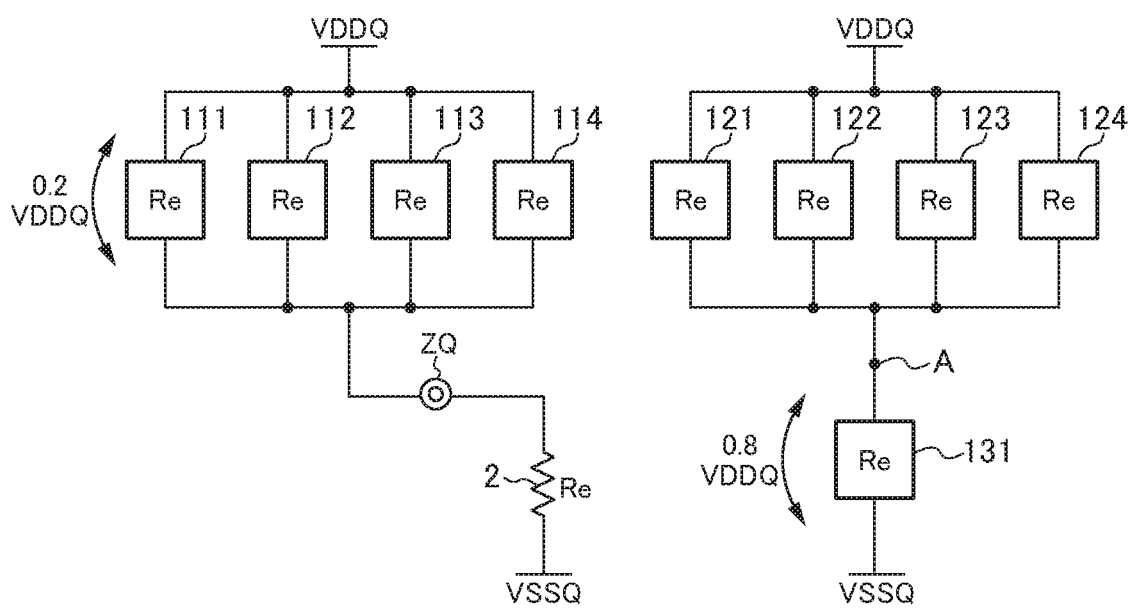
FIG. 10A is a schematic view for explaining calibration operation of p-type transistor units in the first embodiment.
FIG. 10B is a schematic view for explaining calibration operation of an n-type transistor unit in the first embodiment.

In the step S1, the comparator circuit 141 compares the potential of the calibration terminal ZQ with the reference potential VREF, and the counter circuit 142 counts up or down based on the comparison result. After repeating this operation, a situation appears in which the levels of the potential of the calibration terminal ZQ and the reference potential VREF are reversed alternately. This situation means that the potential of the calibration terminal ZQ is the closest to the reference potential VREF. In the step S1, as shown in FIG. 10A, the calibration operation is performed while the four p-type transistor units 111 to 114 that are controlled to have the identical impedance are connected in parallel. Therefore, when the impedance adjustment is performed so that the potential of the calibration terminal ZQ corresponds to the reference potential VREF (=0.8 VDDQ), the impedances of the p-type transistor units 111 to 114 respectively correspond to the impedance Re of the external resistance 2. Additionally, the voltage applied across the p-type transistor units 111 to 114 is 0.2 VDDQ at this time, which corresponds to operating conditions of the p-type transistor units 201 to 20n included in the data output buffer 16a.

When the step S1 is completed, the step S2 is executed while the result of the step S1 is reflected on the p-type transistor units 121 to 124. In the step S2, the comparator circuit 151 compares the potential of the internal node A with the reference potential VREF, and the counter circuit 152 counts up or down based on the comparison result. After repeating this operation, a situation appears in which the levels of the potential of the internal node A and the reference potential VREF are reversed alternately. This situation means that the potential of the internal node A is the closest to the reference potential VREF. In the step S2, as shown in FIG. 10B, the calibration operation of the n-type transistor unit 131 is performed while the four p-type transistor units 121 to 124 that are controlled to have the identical impedance Re are connected in parallel. Therefore, when the impedance adjustment is performed so that the potential of the internal node A corresponds to the reference potential VREF (=0.8 VDDQ), the impedance of the n-type transistor unit 131 corresponds to the impedance Re of each of the p-type transistor units 121 to 124. Additionally, the voltage applied across the n-type transistor unit 131 is 0.8 VDDQ at this time, which corresponds to operating conditions of the n-type transistor units 301 to 30n included in the data output buffer 16a.

After the steps S1 and S2 are completed, the obtained impedance codes DRZQP and DRZQN are supplied to the data output buffer 16a and reflected on the p-type transistor units 201 to 20n and the n-type transistor units 301 to 30n. In this way, the impedances of the respective transistor units constituting the data output buffer 16a correspond to the impedance Re of the external resistance 2. Further, as the impedance codes DRZQP and DRZQN are generated to correspond to the operating conditions of the p-type transistor units 201 to 20n and the n-type transistor units 301 to 30n as described above, the impedances that are actually obtained precisely correspond to the impedance Re of the external resistance 2.

Thus, the precise calibration operation can be provided according to this embodiment because the calibration operation is performed while the operating conditions of the data output buffer 16a are satisfied. Further, the level of the reference potential VREF used in the calibration circuit 100 corresponds to the level of the reference potential VREF used in the data input receiver 3, which does not make the control complicated.

Figure 11:
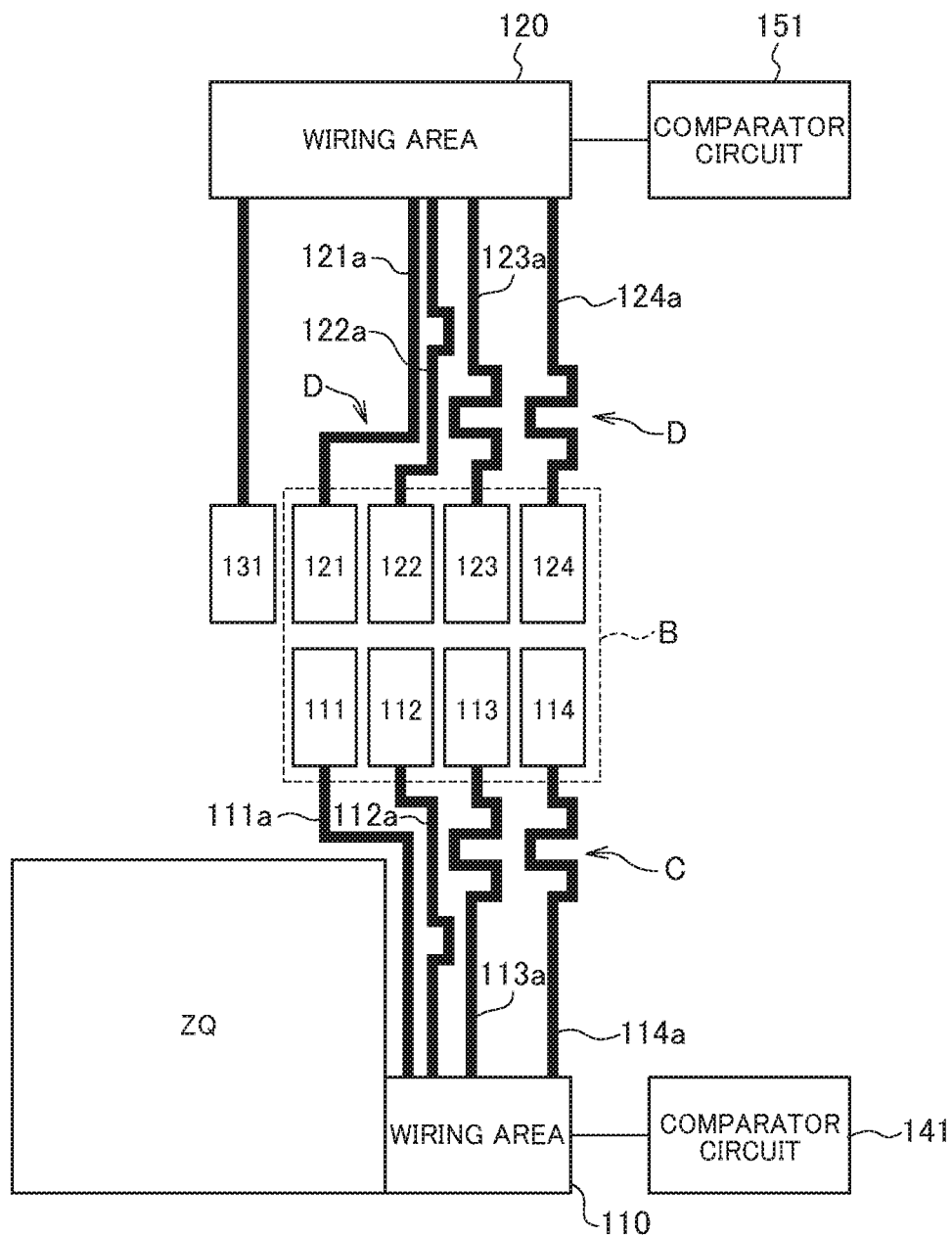
FIG. 11 is a layout chart schematically indicative of an embodiment of the calibration circuit 100.

Turning to FIG. 11, the p-type transistor units 111 to 114 and 121 to 124 are laid out in a group in a central area B. The p-type transistor units 111 to 114 among them are connected to a wiring area 110 that is laid out on one side viewed from the area B, and the p-type transistor units 121 to 124 are connected to a wiring area 120 that is laid out on the other side viewed from the area B. However, space for the wiring area 110 is limited because of the existence of the calibration terminal ZQ and as a result, distances between the transistor units 111 to 114 and the wiring area 110 are not uniform. This may cause a difference in wiring resistance of wires 111a to 114a connecting the transistor units 111 to 114 and the wiring area 110 and, in this case, the impedance code obtained by the calibration operation may have a deviation. As the wires 111a to 114a are replicas of the resistors Rp shown in FIG. 5, it is necessary to design the wires 111a to 114a to have the same resistance values as those of the resistors Rp. This also applies to the wires 121a to 124a. According to the present invention, the wires 111a to 114a and 121a to 124a may be referred to as a "second resistor".

In view of this, detours C are provided in the wires 112a to 114a in the layout shown in FIG. 11 in order to make the lengths thereof correspond to the length of the wire 111a, so that the wires 111a to 114a have the same wiring resistance.

On the contrary, distances between the respective transistor units 121 to 124 and the wiring area 120 are uniform and therefore, a difference is not caused in the wiring resistance of the wires 121a to 124a even when the transistor units 121 to 124 and the wiring area 120 are connected linearly. However, detours D are provided on purpose because the wiring resistance of the wires 121a to 124a needs to correspond to the wiring resistance of the wires 111a to 114a. By doing this, all the wires 111a to 114a and 121a to 124a have the same wiring resistance, which makes it possible to perform the precise calibration operation.

Figure 12:
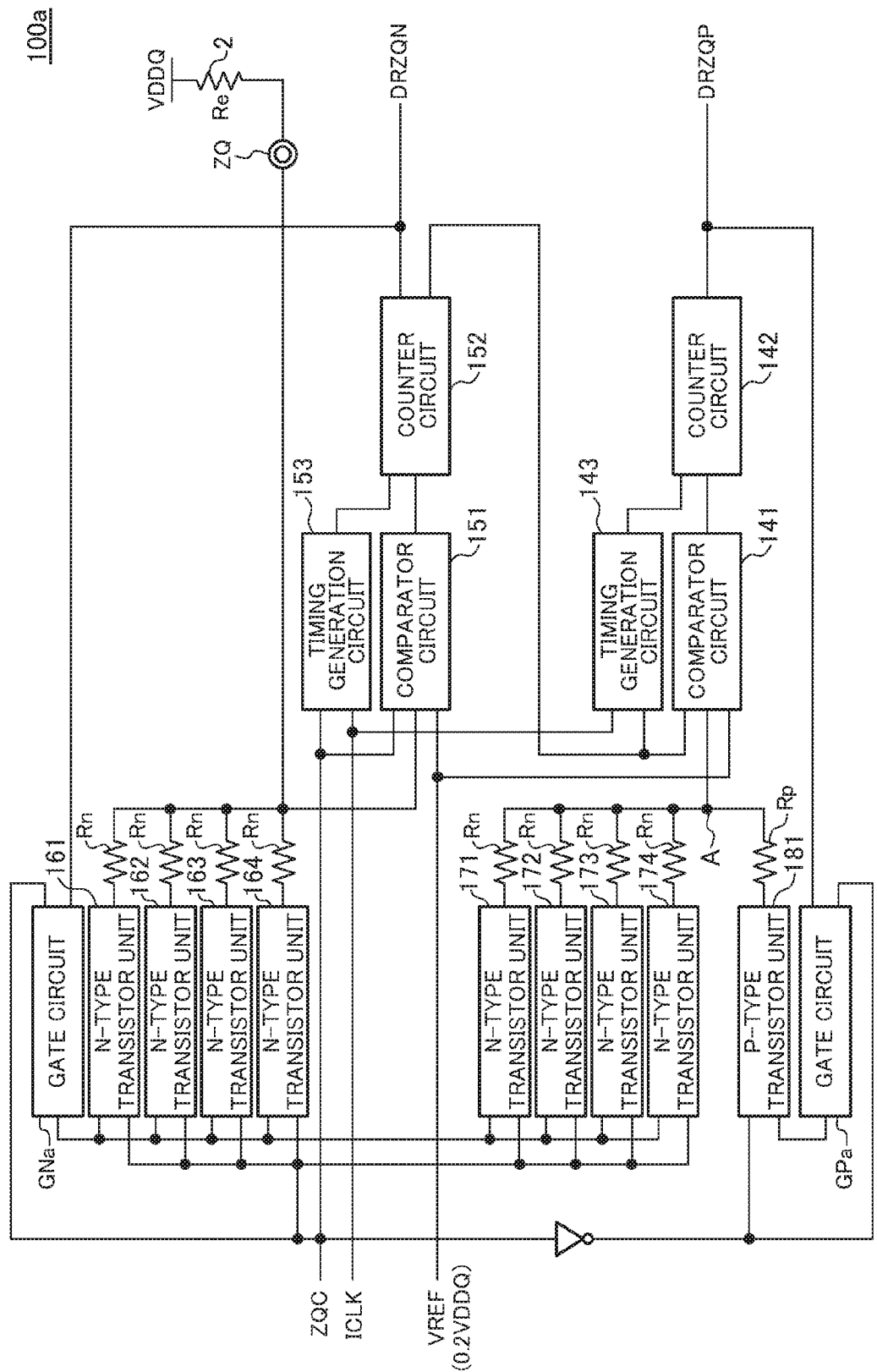
FIG. 12 is a block diagram indicative of an embodiment of the structure of a calibration circuit 100a according to a second preferred embodiment.

Turning to FIG. 12, the calibration circuit 100a of the second embodiment is a circuit suitable for the case where the level of the reference potential VREF that is used in the input/output circuit 16 is 0.2 VDDQ.

The calibration circuit 100a shown in FIG. 12 includes four n-type transistor units 161 to 164 that are connected in parallel to the calibration terminal ZQ, four n-type transistor units 171 to 174 that are connected in parallel to the internal node A and one p-type transistor unit 181. The other end of the external resistance 2 that is connected to the calibration terminal ZQ is connected to the power supply potential VDDQ.

The n-type transistor units 161 to 164 and 171 to 174 are replica buffers of the n-type transistor units 301 to 30n that serve as the pull-down buffers, respectively. Meanwhile, the p-type transistor unit 181 is a replica buffer of each of the p-type transistor units 201 to 20n that serve as the pull-up buffers.

The potential of the calibration terminal ZQ is compared with the reference potential VREF by the comparator circuit 151. The level of the reference potential VREF is 0.2 VDDQ. The comparison result by the comparator circuit 151 is supplied to the counter circuit 152 that generates the impedance code DRZQN. Similarly, the potential of the internal node A is compared with the reference potential VREF by the comparator circuit 141. The comparison result by the comparator circuit 141 is supplied to the counter circuit 142 that generates the impedance code DRZQP.

Figures 13A, 13B:
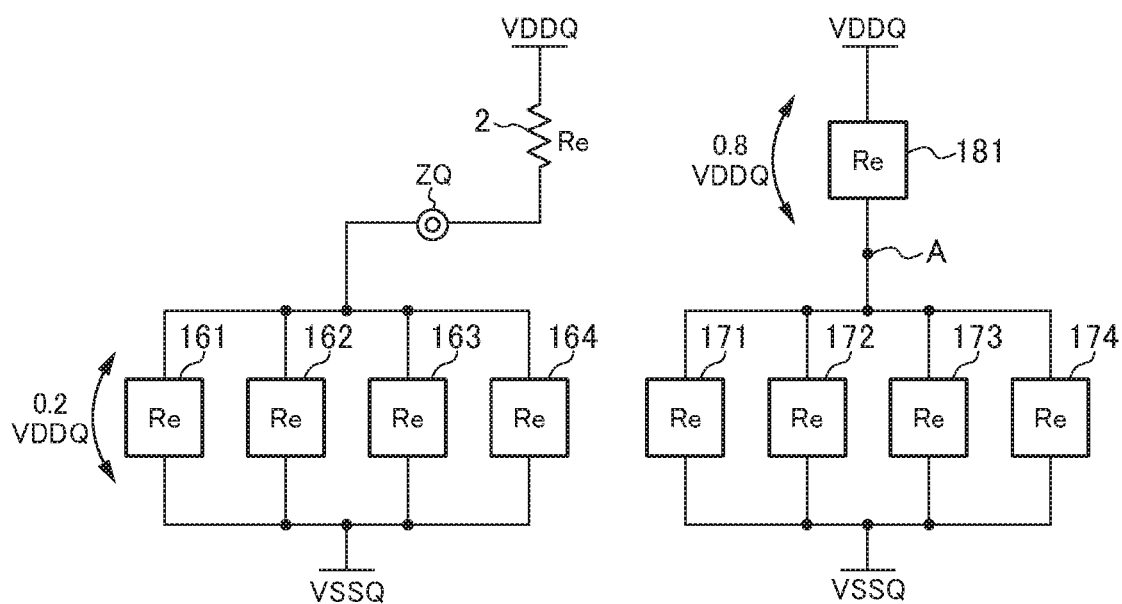
FIG. 13A is a schematic view for explaining calibration operation of n-type transistor units in the second embodiment.
FIG. 13B is a schematic view for explaining calibration operation of a p-type transistor unit in the second embodiment.

In the step S1 of this embodiment, as shown in FIG. 13A, the calibration operation is performed while the four n-type transistor units 161 to 164 that are controlled to have the identical impedance are connected in parallel. Therefore, when the impedance adjustment is performed so that the potential of the calibration terminal ZQ corresponds to the reference potential VREF (=0.2 VDDQ), the impedances of the n-type transistor units 161 to 164 respectively correspond to the impedance Re of the external resistance 2. Additionally, the voltage applied across the n-type transistor units 161 to 164 is 0.2 VDDQ at this time, which corresponds to the operating conditions of the n-type transistor units 301 to 30n included in the data output buffer 16a.

In the step S2 of this embodiment, as shown in FIG. 13B, the calibration operation of the p-type transistor unit 181 is performed while the four n-type transistor units 171 to 174 that are controlled to have the identical impedance Re are connected in parallel. Therefore, when the impedance adjustment is performed so that the potential of the internal node A corresponds to the reference potential VREF (=0.2 VDDQ), the impedance of the p-type transistor unit 181 corresponds to the impedance Re of each of the n-type transistor units 171 to 174. Additionally, the voltage applied across the p-type transistor unit 181 is 0.8 VDDQ at this time, which corresponds to the operating conditions of the p-type transistor units 201 to 20n included in the data output buffer 16a.

After the steps S1 and S2 are completed, the obtained impedance codes DRZQP and DRZQN are reflected on the p-type transistor units 201 to 20n and the n-type transistor units 301 to 30n, and then the calibration operation is completed.

Thus, it is not necessarily required to start the calibration operation from the p-type transistor units according to the present invention, and the calibration operation can be started either from the p-type transistor units or the n-type transistor units, depending on the level of the reference potential VREF.

Figure 14:
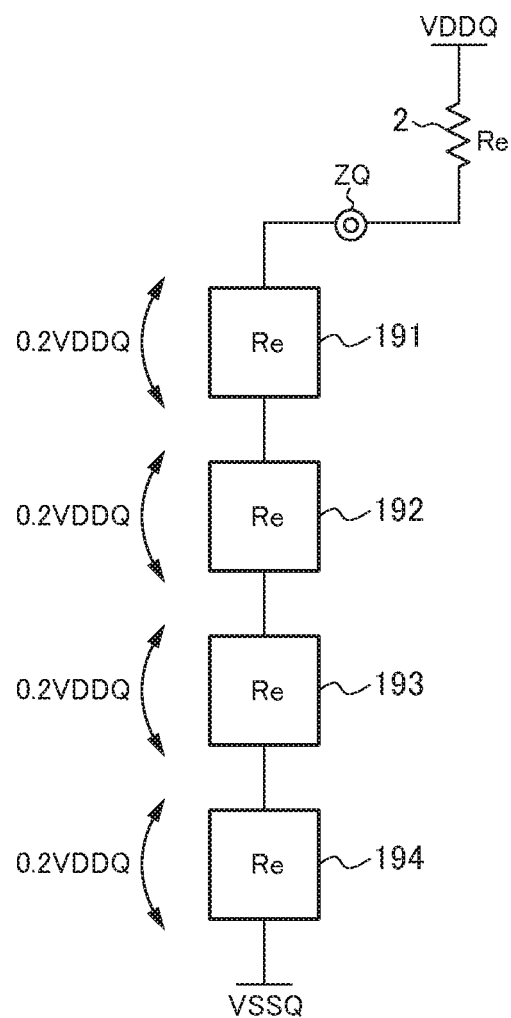
FIG. 14 is a schematic view for explaining a third preferred embodiment of the present invention.

An example shown in FIG. 14 uses a circuit in which four p-type transistor units 191 to 194 are connected in series between the power supply line supplying the power supply potential VSSQ and the calibration terminal ZQ, in performing the calibration operation of the p-type transistor units. The external resistance 2 is connected to the calibration terminal ZQ, and the other end thereof is connected to the power supply potential VDDQ. When the impedance adjustment is performed in this state so that the potential of the calibration terminal ZQ corresponds to the reference potential VREF (=0.8 VDDQ), the impedances of the p-type transistor units 191 to 194 respectively correspond to the impedance Re of the external resistance 2. Additionally, the voltage applied across the p-type transistor units 111 to 114 is 0.2 VDDQ at this time, which corresponds to the operating conditions of the p-type transistor units 201 to 20n included in the data output buffer 16a.

Thus, according to the third embodiment, the plurality of transistor units to be connected to the calibration terminal ZQ can be connected in series.

Figure 15:
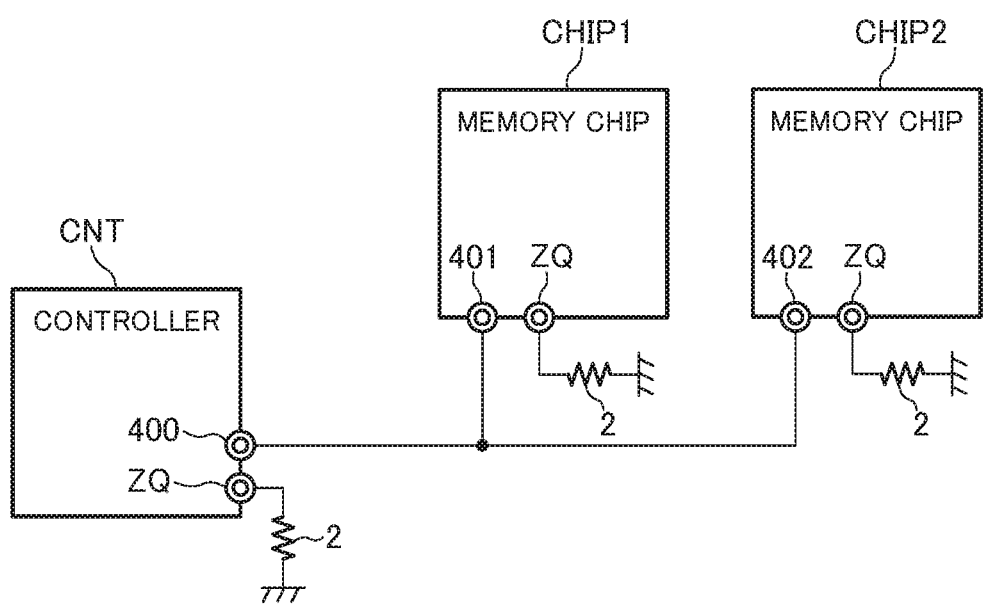
FIG. 15 is a block diagram indicative of an embodiment of the structure of an information processing system including a controller CNT and memory chips CHIP1 and CHIP2.

Turning to FIG. 15, in the information processing system, a data input/output terminal 400 of a controller CNT is commonly connected to data input/output terminals 401 and 402 of memory chips CHIP1 and CHIP2. In the case where a plurality of the data input/output terminals 400 are provided, the data input/output terminals 400 may be individually connected to data input/output terminals 401 and 402, respectively. The memory chips CHIP1 and CHIP2 are devices corresponding to the semiconductor device 10 shown in FIG. 2, and the controller CNT is a device to control the memory chips CHIP1 and CHIP2. According to this embodiment, a calibration terminal ZQ is provided not only in the memory chips CHIP1 and CHIP2, but also in the controller CNT, so as to perform the above-described calibration operation.

Figure 16:
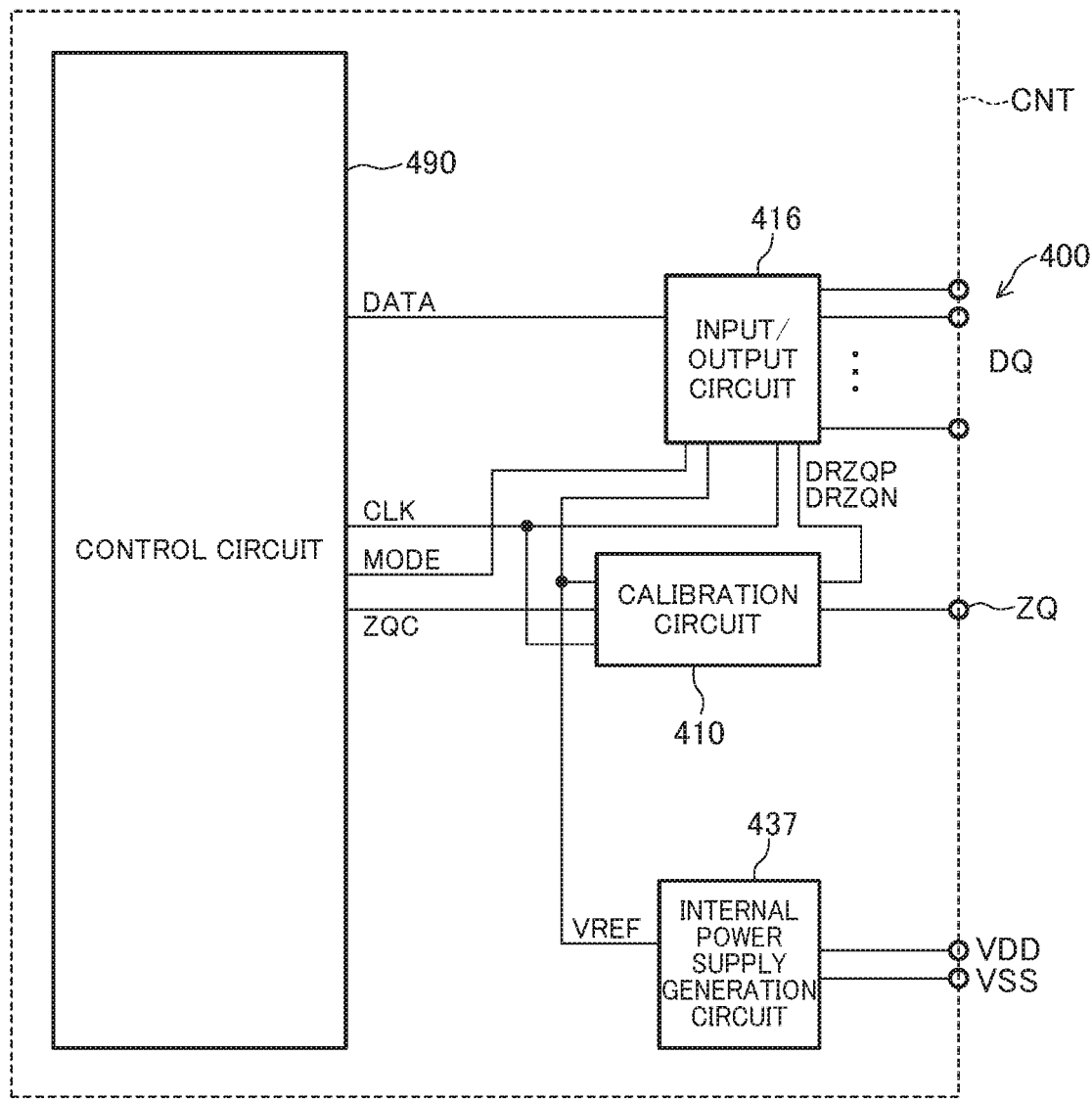
FIG. 16 is a block diagram indicative of an embodiment of the structure of the controller CNT.

Turning to FIG. 16, the controller CNT includes a control circuit 490, an input/output circuit 416, a calibration circuit 410, and an internal power supply generation circuit 437. The input/output circuit 416, the calibration circuit 410, and the internal power supply generation circuit 437 are circuits corresponding to, and have circuit structures and functions similar to the input/output circuit 16, the calibration circuit 100, and the internal power supply generation circuit 37 shown in FIG. 2. The controller CNT also includes other circuits to generate an address ADD and a command CMD, which are not shown in the drawing. As the controller CNT thus includes the calibration circuit 410 that is similar to the calibration circuit 100 included in the above-described semiconductor device 10, it can adjust an impedance of a transistor unit included in the input/output circuit 416 to, for example, 240Ω, similarly to the memory chips CHIP1 and CHIP2.

It is apparent that the present invention is not limited to the above embodiments, but may be modified and changed without departing from the scope and spirit of the invention.

In the above-described embodiments, for example, explanations are made about the cases where the level of the reference potential VREF is 0.8 VDDQ or 0.2 VDDQ by way of examples, but the present invention is not limited thereto. One example is that, when the level of the reference potential VREF is ⅔ VDDQ, the p-type transistor units 113, 114, 123 and 124 may be omitted from the calibration circuit 100 shown in FIG. 8 and the two p-type transistor units may be connected in parallel to perform the calibration operation.

Moreover, according to the present invention, it is not necessarily required that the data output buffer 16a includes the plurality of p-type transistor units and the plurality of n-type transistor units. When the switching of the impedance using the mode register 14 is not necessary, one p-type transistor unit and one n-type transistor unit will suffice.

In addition, while not specifically claimed in the claim section, the applicant reserves the right to include in the claim section of the application at any appropriate time the following semiconductor module:

A semiconductor module comprising:
a module board; and a semiconductor device and an external resistance mounted on the module board,
wherein the semiconductor device comprises:
a data terminal;
a calibration terminal to which the external resistance is connected;
a first transistor unit coupled to the data terminal;
a plurality of second transistor units coupled to the calibration terminal; and
an impedance control circuit adjusting an impedance of each of the second transistor units so that the impedance of each of the second transistor units matches with an impedance of the external resistance, the impedance control circuit reflecting the impedance of one of the second transistor units to the first transistor unit.

What is claimed is:

1. A semiconductor device comprising:
a data terminal;
a calibration terminal;
a first power supply line configured to be supplied with a first power supply potential;
a second power supply line configured to be supplied with a second power supply potential;
a first transistor unit coupled between the first power supply line and the data terminal;
a plurality of second transistor units coupled between the second power supply line and the calibration terminal, wherein each second transistor unit of the plurality of second transistor units comprises a plurality of transistors coupled to a resistor, the plurality of transistors and the resistor are not shared with other second transistor units, and the plurality of second transistor units are connected in parallel to each other so that an impedance of each of the second transistor units is adjustable using an impedance code; and
an impedance control circuit configured to adjust the impedance of each of the second transistor units so that a potential of the calibration terminal matches a reference potential, the impedance control circuit reflecting the impedance of one of the second transistor units to the first transistor unit; and
wherein the reference potential is different in potential level from an intermediate potential between the first power supply potential and the second power supply potential.

2. The semiconductor device of claim 1, wherein the first power supply potential is VDDQ and wherein the reference potential is 0.8 VDDQ.

3. The semiconductor device of claim 1, wherein the first power supply potential is VDDQ and wherein the reference potential is greater than 0.5 VDDQ and less than VDDQ.

4. A system comprising:
a first semiconductor device comprising:
a first data input/output (I/O) terminal; and
a first calibration terminal; and
a controller comprising:
a control circuit;
a data I/O circuit;
a second data I/O terminal, the second data I/O terminal being coupled to the data I/O circuit and the second data I/O terminal being coupled to the first data I/O terminal of the first semiconductor device;
a calibration terminal;
a first transistor unit coupled to the second data I/O terminal, the first transistor unit including a plurality of first transistors having a first conductivity type connected in parallel to each other, wherein an impedance of the first transistor unit is adjustable;
a plurality of second transistor units coupled to the calibration terminal, each of the second transistor units including a plurality of second transistors having the first conductivity type connected in parallel to each other, the plurality of second transistors coupled to a resistor, and the plurality of second transistors and the resistor are not shared with other second transistor units, wherein an impedance of each of the second transistor units is adjustable; and
an impedance control circuit configured to:
adjust the impedance of each of the second transistor units so that a potential of the calibration terminal matches a reference potential; and
control an impedance of the first transistor unit in accordance with the adjusted impedance of the second transistor units.

5. The system of claim 4, wherein the first power supply potential is VDDQ and wherein the reference potential is 0.8 VDDQ.

6. The system of claim 4, wherein the first power supply potential is VDDQ and wherein the reference potential is greater than 0.5 VDDQ and less than VDDQ.

7. A controller for operating a semiconductor device, the controller comprising:
a control circuit;
a data input/output (I/O) circuit; and
a data I/O terminal coupled to the data I/O circuit, wherein the data I/O terminal is configured to be coupled to a data I/O terminal of a semiconductor device;
a calibration terminal;
a first transistor unit coupled to the data I/O terminal, the first transistor unit including a plurality of first transistors having a first conductivity type connected in parallel to each other, wherein an impedance of the first transistor unit is adjustable;
a plurality of second transistor units coupled to the calibration terminal, each of the second transistor units including a plurality of second transistors having the first conductivity type connected in parallel to each other, the plurality of second transistors coupled to a resistor, and the plurality of second transistors and the resistor are not shared with other second transistor units, wherein an impedance of each of the second transistor units is adjustable; and
an impedance control circuit configured to:
adjust the impedance of each of the second transistor units so that a potential of the calibration terminal matches a reference potential; and
control an impedance of the first transistor unit in accordance with the adjusted impedance of the second transistor units.

8. The controller of claim 7, wherein the first power supply potential is VDDQ and wherein the reference potential is 0.8 VDDQ.

9. The controller of claim 7, wherein the first power supply potential is VDDQ and wherein the reference potential is greater than 0.5 VDDQ and less than VDDQ.

* * * * *